(12) United States Patent  
Capofreddi

(10) Patent No.: US 6,542,104 B1
(45) Date of Patent: Apr. 1, 2003

(54) METHOD AND APPARATUS FOR LOW POWER THERMOMETER TO BINARY CODER

(75) Inventor: Peter Capofreddi, San Francisco, CA (US)

(73) Assignee: Santel Networks, Inc., Newark, CA (US)

(*) Notice: Subject to any disclaimer, the term of this patent is extended or adjusted under 35 U.S.C. 154(b) by 0 days.

(21) Appl. No.: 10/050,261

(22) Filed: Oct. 22, 2001

(51) Int. Cl.[7] ............................................. H03M 2/36
(52) U.S. Cl. ........................ 341/160; 341/102; 341/103; 341/159
(58) Field of Search ................................. 341/102, 103, 341/159, 160

(56) References Cited

U.S. PATENT DOCUMENTS

| | | | | | |
|---|---|---|---|---|---|
| 4,586,025 A | * | 4/1986 | Knierim | ............ | 341/160 |
| 4,733,220 A | * | 3/1988 | Knierim | ............ | 341/160 |
| 5,029,305 A | * | 7/1991 | Richardson | ............ | 341/159 |
| 5,243,348 A | * | 9/1993 | Jackson | ............ | 341/160 |
| 5,329,279 A | * | 7/1994 | Barbu et al. | ............ | 341/160 |
| 5,459,466 A | * | 10/1995 | Knierim et al. | ............ | 326/43 |
| 5,623,265 A | * | 4/1997 | Pawar et al. | ............ | 341/159 |
| 5,714,949 A | * | 2/1998 | Watabe | ............ | 341/67 |
| 5,889,487 A | * | 3/1999 | Burns et al. | ............ | 341/159 |
| 5,959,564 A | * | 9/1999 | Gross, Jr. | ............ | 341/160 |
| 6,388,602 B1 | * | 5/2002 | Yang | ............ | 341/155 |
| 6,441,768 B2 | * | 8/2002 | Cho et al. | ............ | 341/155 |

* cited by examiner

Primary Examiner—Michael Tokar
Assistant Examiner—Khai Nguyen
(74) Attorney, Agent, or Firm—Pillsbury Winthrop LLP

(57) ABSTRACT

An improved thermometer-to-binary coder in which the bits of the thermometer code are used to directly generate the binary code without using an intermediate one-hot code.

20 Claims, 7 Drawing Sheets

PRIOR ART

PRIOR ART

PRIOR ART

US 6,542,104 B1

METHOD AND APPARATUS FOR LOW POWER THERMOMETER TO BINARY CODER

BACKGROUND

1. Field of the Invention

The invention relates generally to analog and digital signal processing. More specifically, the invention relates to the implementation of binary encoders for use in analog-to-digital converters.

2. Related Art

In the art of mixed-mode signal processing, so-called "thermometer-to-binary" coders are used in "Flash" analog-to-digital (A/D) converters to encode the output of a set of $2^n-1$ comparators into an n-bit binary code. A typical flash A/D converter is depicted in FIG. 1. The input (represented as a voltage signal) is compared to a set of thresholds (generated from a positive reference and negative reference by a resistor ladder or other means). The comparators generate a so-called thermometer code, in which the value of the input signal is represented by a binary code in which increasing numbers of bits are turned on, as shown in Table 1 of the Appendix. For digital signal processing applications, the more compact binary code is ordinarily used to represent the signal. The A/D converter in such cases must include an encoder to convert from one format to another. However, as shown below, conventional encoders consume a significant amount of power and die area.

FIG. 2 shows a conventional thermometer-to-binary coder. The coder 200 first converts from the binary code to a "one hot" code, which is then used to address a read-only memory to generate the binary code. The one-hot code is a code in which each symbol is represented by a vector that has one element equal to one while all of the other elements are equal to zero. Thus, in a one-hot code, there is a bit position for every symbol and the number of symbols determines the length of each codeword. While such encoding is easy to decode (since only one bit needs to be discovered), it can often add significant cost when implemented in digital circuitry.

Referring to FIG. 2, at each of the AND gates 210, the thermometer code bit is combined with the inverse of the next higher bit. Thus, the bits T0 and ~T1 are combined by an AND logic gate from AND gates 210 to yield the one-hot code C0. Likewise, the one-hot code C1 is obtained by combining the bit T1 with the inverse of bit T2 (~T2) at another parallel AND logic gate. In general, the intermediate one-hot code Ci is obtained from Ti∩~Ti+1. The one-hot code Ci is used to address the memory bank (shown implemented in MOS transistors) that then read out the corresponding binary code B0, B1, B2, B3. The number of transistors used for each one-hot code varies, as depicted in FIG. 2. A thermometer to binary encoder if implemented in a CMOS technology would use a total of at least $2^{N-1}(N+12)+2N-6$ transistors, where N is the number of bits in the resulting binary code. If implemented in bipolar technology, such an encoder would use at least $2^{N-1}(N+18)+3N-9$ transistors. One problem with the encoder of FIG. 2 is its susceptibility to so-called "bubble" codes, which are invalid thermometer codes where the high signals are not contiguous. Bubble codes occur as a result of thermal noise in the comparators.

FIG. 3 illustrates another conventional thermometer-to-binary coder. This encoder is not as sensitive as that of FIG. 2 to "bubble codes". The response of the encoders of FIGS. 2 and 3, to various bubble codes is shown in Table 2 of the Appendix. The reduced sensitivity of the encoder of FIG. 3 is evident from the fact that the encoded value is always one of the two ambiguous interpretations of the bubble code. However, the FIG. 3 encoder is expensive in terms of the number of transistors used. It uses a minimum of $2^{N-1}(N+16)+2N-6$ transistors in CMOS technology, or a minimum of $2^{N-1}(N+26)+3N-17$ transistors in bipolar technology. It also uses a more expensive logic than the coder of FIG. 2 in that three-input AND gates and various inverting terminals are used in the one-hot code determination.

Thus, there is a need for a thermometer to binary code converter which is less expensive than conventional converters and is also less sensitive to bubble thermometers than conventional converters.

SUMMARY

The invention consists of an improved thermometer-to-binary coder in which the bits of the thermometer code are used to directly generate the binary code without using an intermediate one-hot code. The improved coder manipulates the observable common features between the thermometer code and the resulting binary code. The thermometer code bits are grouped according these observable common features and then a selection process which operates in layers, selects thermometer code bits that can be utilized as binary code bits.

DETAILED DESCRIPTION OF THE INVENTION

In brief, the invention consists of an improved thermometer-to-binary coder in which the bits of the thermometer code are used to directly generate the binary code without using an intermediate one-hot code. The improved coder manipulates the mapping between the thermometer code and the resulting binary code. In one embodiment, multiplexers are used in a layered cascading configuration to generate the bits of the binary code directly from the thermometer code. This embodiment can be implemented in a variety of ways, including, by way of CMOS circuitry and by current-mode logic circuitry.

Figure 4:
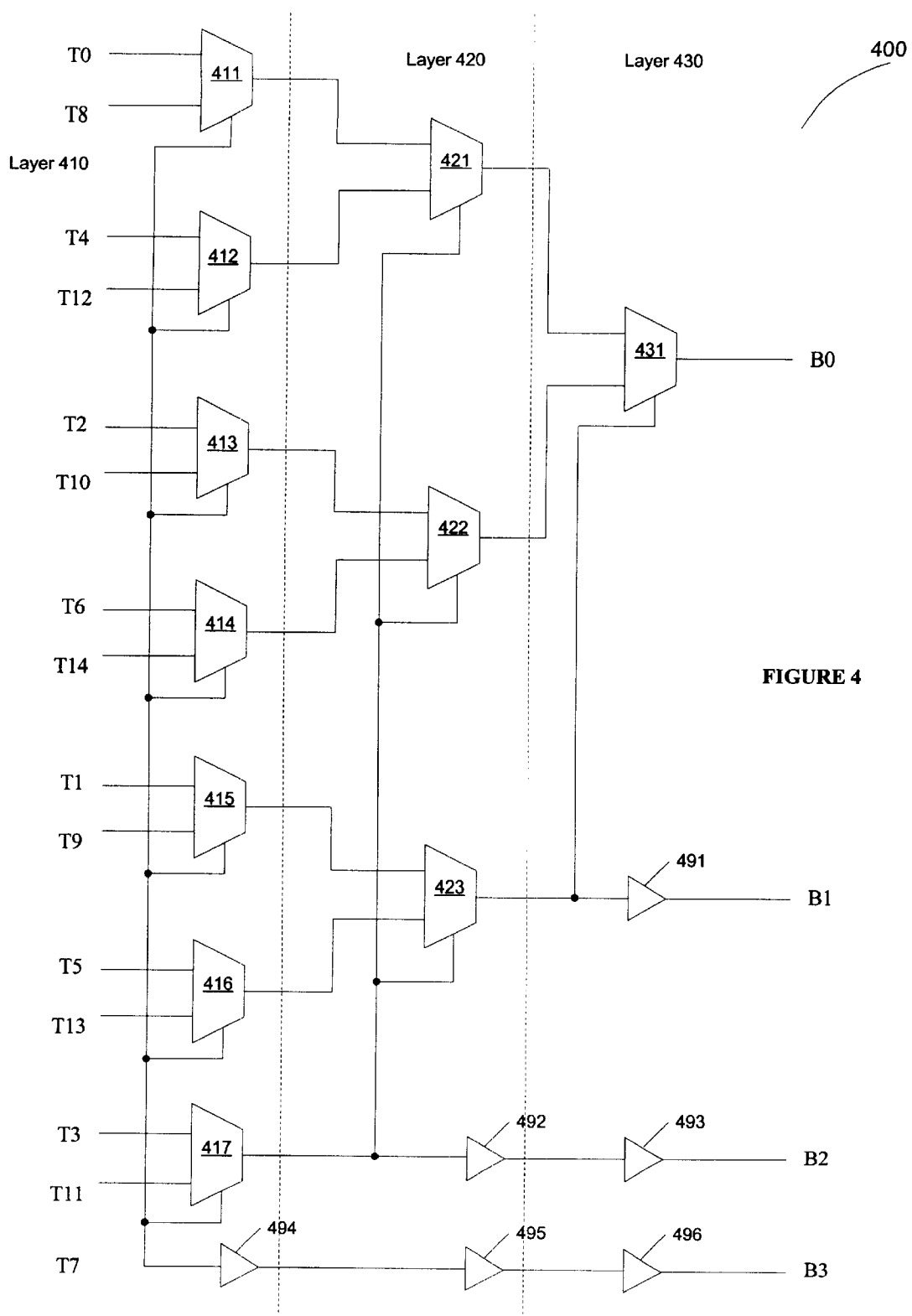
FIG. 4 illustrates one logical embodiment of the invention.

FIG. 4 illustrates one logical embodiment of the invention. The coder 400 of FIG. 4 shows a 15-bit thermometer code input having bits designated T0 . . . T14. In converting these to a binary code, 4 bits would be required. In the case of a four-bit A/D converter, for example, the following observations can be made from Table 1 of the Appendix. If the thermometer code bit T7 is high, then the correct binary output code B3 will be high. T7 can therefore be used directly as the B3 output with no intermediate logic. The state of T7 also divides all of he binary output code states into two groups. The first group encodes the thermometer bits T0 through T7. In this first group, the T7 bit is always low. The second group encodes the thermometer bits T8 through T15. In this second group, the T7 bit is always high. Within the first group, the binary output code bit B2 is always equal to the thermometer code bit T3. Within the second group, the binary bit B2 is always equal to the thermometer code bit T11. B2 can therefore be determined by multiplexing T3 and T11 under the control of T7. T3 or T11 similarly divide the codes into yet smaller groups, and in each of these groups the next binary output code bit B1 is determined by one of the thermometer code bits T1, T5, T9 or T13. Similarly, thermometer code bits T0, T2, T4, T6, T8, T10, T12 or T14 determine B0.

Using these different groupings, a layered logic such as that depicted in FIG. 4 can be implemented. In the coder 400, three layers are depicted. The first layer 410 has a set of seven multiplexers, 411, 412, 413, 414, 415, 416 and 417, each of which accept various pairs of thermometer code bits as inputs. The layer 410, which represents the highest level grouping of the thermometer code bits which is controlled by the state of thermometer it T7. Thus, each of the first layer 410 multiplexers 411, 412, 413, 414, 415, 416 and 417, uses the bit T7 as a selector control. Following the observation that the binary output code bit B2 equals T3 when T7 is low and equals T11 when T7 is high, T3 and T11 are both input to multiplexer 417. Accordingly, multiplexer 417 selects T3 when T7 is low and selects T11 when T7 is high. Likewise, T0 and T8 are inputs to multiplexer 411, with T0 selected when T7 is low, and T8 selected when T7 is high. T4 and T12 are inputs to multiplexer 412, with T4 selected when T7 is low, and T8 selected when T7 is high. T2 and T10 are inputs to multiplexer 413, with T2 selected when T7 is low, and T10 selected when T7 is high. T6 and T14 are inputs to multiplexer 414, with T6 selected when T7 is low, and T14 selected when T7 is high. T1 and T9 are inputs to multiplexer 415, with T1 selected when T7 is low, and T9 selected when T7 is high. Finally, T5 and T13 are inputs to multiplexer 415, with T5 selected when T7 is low, and T13 selected when T7 is high.

The outputs of the first layer 410 are utilized in various measure as follows. The output of multiplexer 417 forms the binary output code bit B2. Buffers 492 and 493 are inserted in the data path from the output of multiplexer 417 for the sake of convenience, so that the binary code bits will be available in a concurrent fashion. Since T7 forms the least significant bit B3 of the binary output code, it is provided without the need for multiplexing with other bits. Since the output B3 is available the earliest, three buffers 494, 495 and 496 can be inserted in the data path thereof to again ensure that the binary output code bits are available in concurrency. The outputs of multiplexers 411, 412, 413, 414, 415 and 416 are all provided as inputs to the second logic layer 420.

Specifically, the second layer 420 includes a set of three multiplexers, 421, 422 and 423 which perform further grouping of the outputs from layer 410. Specifically, the output of multiplexer 411 from layer 410 and the multiplexer 412 from layer 410 are wired as the two inputs of multiplexer 421 of layer 420. Likewise, the output of multiplexer 413 from layer 410 and the multiplexer 414 from layer 410 are wired as the two inputs of multiplexer 422 of layer 420. Also, the output of multiplexer 415 from layer 410 and the multiplexer 416 from layer 410 are wired as the two inputs of multiplexer 421 of layer 420.

The select signal for each of the layer 2 multiplexers 421, 422 and 423 is the output of multiplexer 417 (which is either one of the thermometer inputs T3 and T11). When the output of multiplexer 417 is high, multiplexer 423 selects as its output the input from multiplexer 416 (either T5 or T13). When the output of multiplexer 417 is low, multiplexer 423 selects as its output the input from multiplexer 415 (either T1 or T9). Likewise, when the output of multiplexer 417 is high, multiplexer 422 selects as its output the input from multiplexer 414 (either T6 or T14). When the output of multiplexer 417 is low, multiplexer 422 selects as its output the input from multiplexer 413 (either T2 or T10). Lastly, when the output of multiplexer 417 is high, multiplexer 421 selects as its output the input from multiplexer 412 (either T4 or T12). When the output of multiplexer 417 is low, multiplexer 421 selects as its output the input from multiplexer 411 (either T0 or T8).

The outputs of multiplexers 421, 422 and 423 are all provided to a third layer 430. The output of multiplexer 423 represents the choice among the thermometer inputs T1, T9, T5 and T13, and thus, can, after delay by buffer 491, be read out as the binary code bit B1. The outputs of multiplexers 421 and 422 from layer 2 form the inputs to the layer 3 multiplexer 431. The output from multiplexer 423 (in other words, the binary code bit B1) is the select signal for multiplexer 431 of layer 3. If the output of multiplexer 423 is high, then the output of multiplexer 422 is selected as the output of multiplexer 431. If the output of multiplexer 423 is low, then the output of multiplexer 421 is selected as the output of multiplexer 431. The output of layer 3 multiplexer 431 is a selection among the thermometer inputs T0, T8, T4, T12, T2, T10, T6 and T14 and as such, forms the binary code bit B0.

The resolution of a thermometer code of 15 bits as shown in converter 400 of FIG. 4 is merely an exemplary embodiment of the invention where a binary code of four bits is desired. More generally, for the case of an n-bit coder, the binary code bits B[j] are determined with a series of multiplexers that select from the thermometer code bits T(i) according to the following algorithm:

$$B[n-1]=T(2^{n-1}-1);$$

$$B[n-2]=T(2^{n-1}B[n-1]+2^{n-2}-1);$$

$$B[n-3]=T(2^{n-1}B[n-1]+2^{n-2}B[n-2]+2^{n-3}-1);$$

$$B[n-4]=T(2^{n-1}B[n-1]+2^{n-2}B[n-2]+2^{n-3}B[n-3]+2^{n-4}-1)$$

. . .

and more generally, $$B[n-m] = T\left(\sum_{k=1}^{m-1} 2^{n-k}B[n-k] + 2^{n-m} - 1\right),$$

where a low value of a thermometer bit T(i) or of a binary code bit B[j] evaluates to numerical zero, and a high value of a thermometer bit T(i) or of a binary code bit B[j] evaluates to numerical one.

To illustrate the operation of the converter 400, consider the thermometer code conversion of the symbol labeled "5" in Table 1 of the Appendix to a 4-bit binary code. The symbol (value) "5" has a thermometer code of:

| T0 | T1 | T2 | T3 | T4 | T5 | T6 | T7 | T8 | T9 | T10 | T11 | T12 | T13 | T14 |
|----|----|----|----|----|----|----|----|----|----|-----|-----|-----|-----|-----|
| H  | H  | H  | H  | H  | L  | L  | L  | L  | L  | L   | L   | L   | L   | L   |

The binary code bit B3 was observed to be T7. Since T7 is low, B3 will also be low. This also complies with the generalization specified above, namely, where n=4, B[3]=T($2^{4-1}-1$)=T(7). The value of T7 (Low) provides the select signal for all of the multiplexers in layer 410. Accordingly, multiplexer 417 selects T3, multiplexer 416 selects T5, multiplexer 415 selects T1, multiplexer 414 selects T6, multiplexer 413 selects T2, multiplexer 412 selects T4 and multiplexer 411 selects T0 as their respective outputs. The output of multiplexer 417 which is T3, is the binary code bit B2. Since T3 is H (High) from the above table, B2 is also High (value of 1). This complies with the generalization given above, namely, for n=4, B[2]=B[n-2]=T($2^{n-1}$B[n-1]+ $2^{n-2}-1$)=T(8*B[3]+4-1). Since B3 was observed to be Low, B[2]=T(8*0+4-1) or T(3), which is a High value. Thus far, the binary code is resolved to B3=Low and B2=High.

The output of multiplexer 417 is used as a selector signal for multiplexers of the second layer 420. Since the output of multiplexer 417 is high, multiplexer 423 would select as its output the value input by multiplexer 416, or T5. Likewise, multiplexer 422 selects the input from multiplexer 414 or T6 and multiplexer 421 selects the input from multiplexer 412 or T4. The output of multiplexer 423, which is T5, forms the third binary code bit B1. This complies with the generalization given above, since n=4, B[2]=1 (High), and B[3]=0 (Low), B[n-3]=B[1]=T(8*B[3]+4*B[2]+1)=T(8*0+4*1+1)=T(5). Since T5 is a Low value, B[1] (B1) also assumes a Low value.

The output of multiplexer 423 (or B1) is the select signal for the third layer 430 which has a multiplexer 431. Since the output of multiplexer 423 is Low, multiplexer 431 selects the input from multiplexer 421, which is T4. The output of multiplexer 431 is the binary code bit B0. This complies with the generalization above, since n=4, B[1]=0 (Low), B[2]=1 (High), B[3]=0 (Low), B[n-4]=B[0]=T(8*B[3]+ 4*B[2]+2*B[1]+1-1)=T(8*0+4*1+2*0)=T(4). Since T4 has a High value, the binary code bit B[0] (B0) will be resolved as High. B0 is the last of the binary code bits to be resolved, and thus, the entire binary code in 4 bits is fully resolved as LHLH or 0101, which is the correct binary code for "5".

As mentioned above, some of the binary code bits are resolved (evaluated) before others and hence, buffers are inserted in the various data paths so that the binary code bits are available at the same time. The buffers are may not be necessary for practicing the invention, and are provided as an implementation detail. The logical layering structure of the invention allows a large number of thermometer code bits to be converted to their binary equivalent in an efficient manner. The converter 400 of FIG. 4 exemplifies the conversion of a thermometer code with a length of 15 bits to a four bit binary code which is implemented in three layers by eleven total multiplexers. Encoding a thermometer code of length 7 to a three bit binary code, for instance, could be implemented in two layers by four multiplexers. In general, an encoder to convert a thermometer code of length $2^n-1$ bits to a binary code of length n bits can be implemented using $2^n-n-1$ multiplexers.

The converter 400 has fewer transistors than that of conventional converters and is thus lower in cost/space to implement. The sensitivity of converter 400 to bubble codes is also quite low. Table 2 of the Appendix shows that for each bubble thermometer code, the resolved binary code is one of the intended actual values that the thermometer code would have referred to were it not for the bubble abnormality. For instance, referring to the bubble code which could have encoded either of values 7 or 9, the converter 400 resolves the bubble code to the value 7. By contrast, the converter 200 of FIG. 2 resolves the same bubble code to a value of 15. This is a severe resolution error since there is a zero probability of the resolved value being equal to the intended actual value. In each bubble thermometer code shown in Table 2, the resolved value is in each case one of the actual intended values, and thus, gives a 50% probability of accuracy for each resolved value. By comparison, some of the resolved values for the conventional converters 200 and 300 do not even match any of the possible values for the given bubble code.

Figure 5:
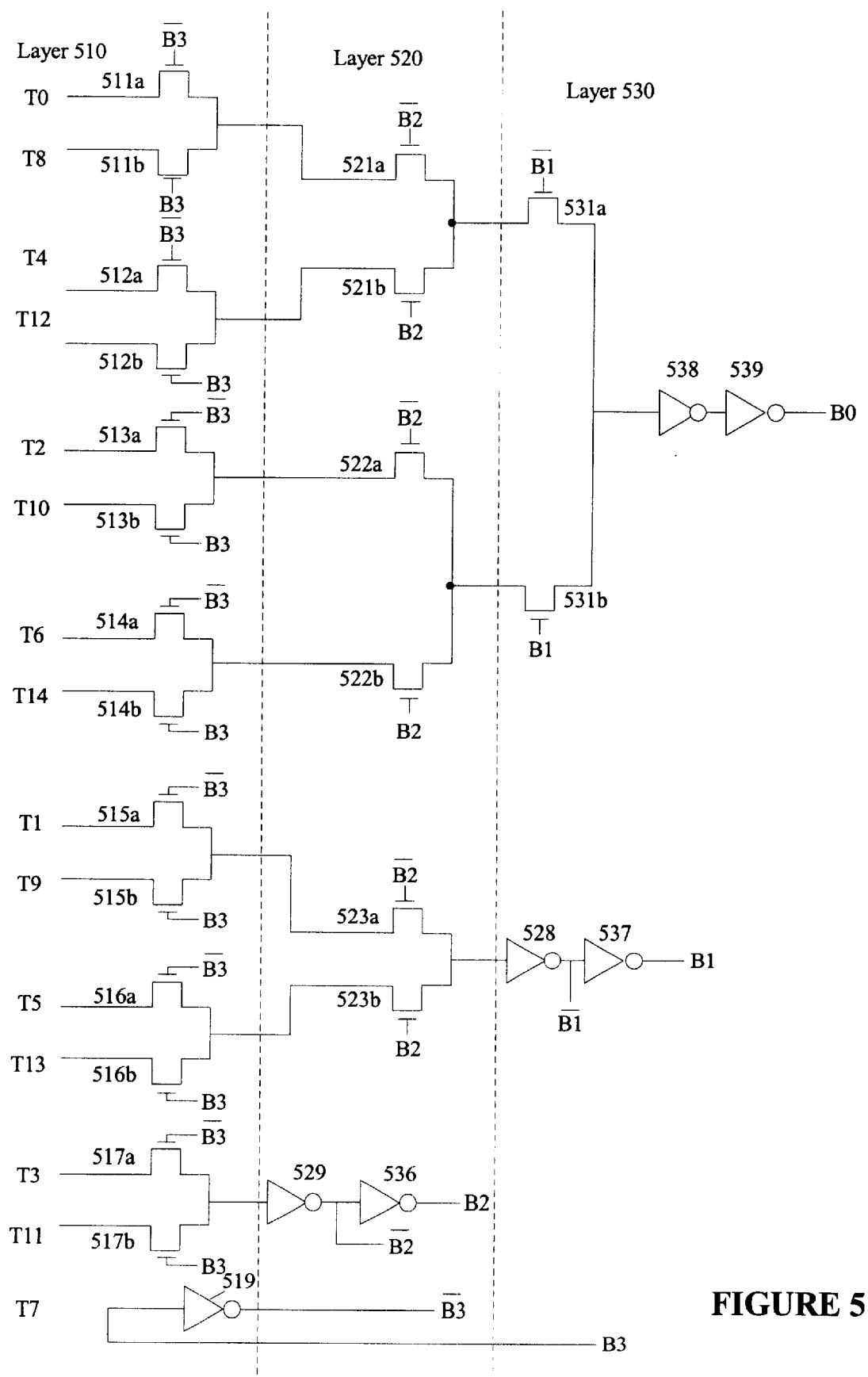
FIG. 5 illustrates a CMOS embodiment of the invention.

FIG. 5 illustrates a CMOS embodiment of the invention. The converter 500 is an embodiment of the invention utilizing CMOS transistor switching circuitry. Using the same layered logic approach depicted for converter 400 in FIG. 4, multiplexing is implemented instead by active switching devices. Specifically, the first layer 510 consists of pairs of CMOS transistor devices for every pair of inputs that must be selected from. The switching of all transistors in the first layer 510 are controlled by the thermometer code input T7, which is observed to be the B3 binary code bit. For instance, a transistor pair 511a and 511b perform selection between T0 and T8. When B3 is high, the complement of B3 (~B3) is low, and consequently, transistor 511a is switched off while transistor 511b is switched on. This allows the thermometer code input T8 to be switched through layer 510, and input T0 to be suppressed. Likewise, when B3 is low, transistor 511a is switched on (since the complement of B3, ~B3 is high) and transistor 511b is switched off. This has the effect of passing T0 while suppressing T8 from layer 510.

In a similar manner, a transistor pair 512a and 512b perform selection between T4 and T12. When B3 is high, the complement of B3 (~B3) is low, and consequently, transistor 512a is switched off while transistor 512b is switched on. This allows the thermometer code input T12 to be switched through layer 510, and input T4 to be suppressed. Likewise, when B3 is low, transistor 512a is switched on (since the complement of B3, ~B3 is high) and transistor 512b is switched off. This has the effect of passing T4 while suppressing T12 from layer 510.

A transistor pair 513a and 513b perform selection between T2 and T10. When B3 is high, the complement of B3 (~B3) is low, and consequently, transistor 513a is switched off while transistor 513b is switched on. This allows the thermometer code input T10 to be switched through layer 510, and input T2 to be suppressed. Likewise, when B3 is low, transistor 513a is switched on (since the complement of B3, ~B3 is high) and transistor 513b is switched off. This has the effect of passing T2 while suppressing T10 from layer 510.

A transistor pair 514a and 514b perform selection between T6 and T14. When B3 is high, the complement of B3 (~B3) is low, and consequently, transistor 514a is switched off while transistor 514b is switched on. This allows the thermometer code input T14 to be switched through layer 510, and input T6 to be suppressed. Likewise, when B3 is low, transistor 514a is switched on (since the complement of B3, ~B3 is high) and transistor 514b is switched off. This has the effect of passing T6 while suppressing T14 from layer 510.

A transistor pair 515a and 515b perform selection between T1 and T9. When B3 is high, the complement of B3 (~B3) is low, and consequently, transistor 515a is switched off while transistor 515b is switched on. This allows the thermometer code input T9 to be switched through layer 510, and input T1 to be suppressed. Likewise, when B3 is low, transistor 515a is switched on (since the complement of B3, ~B3 is high) and transistor 515b is switched off. This has the effect of passing T1 while suppressing T9 from layer 510.

A transistor pair 516a and 516b perform selection between T5 and T13. When B3 is high, the complement of B3 (~B3) is low, and consequently, transistor 516a is switched off while transistor 516b is switched on. This allows the thermometer code input T13 to be switched through layer 510, and input T5 to be suppressed. Likewise, when B3 is low, transistor 516a is switched on (since the complement of B3, ~B3 is high) and transistor 516b is switched off. This has the effect of passing T5 while suppressing T13 from layer 510.

A transistor pair 517a and 517b perform selection between T3 and T11. When B3 is high, the complement of B3 (~B3) is low, and consequently, transistor 517a is switched off while transistor 517b is switched on. This allows the thermometer code input T11 to be switched through layer 510, and input T3 to be suppressed. Likewise, when B3 is low, transistor 517a is switched on (since the complement of B3, ~B3 is high) and transistor 517b is switched off. This has the effect of passing T3 while suppressing T11 from layer 510.

The second layer 520 further switches the thermometer code input bits passed through layer 510 by its various transistor pairs. Layer 520 utilizes only three transistor pairs for this purpose, since the output of transistor pair 517a and 517b is observed to resolve to the binary code bit B2, and is thus, not switched. A first transistor pair 521a and 521b is switched under the control of B2 and the complement of B2 (~B2). If B2 is high, 521b is switched on and 521a is off (since ~B2 would be low). This has the effect of passing through layer 520 the thermometer code bit passed by transistor pair 512a and 512b (either T4 or T12). If B2 is low, 521b is switched off and 521a is switched on (since ~B2 would be high). This has the effect of passing through layer 520 the thermometer code bit passed by transistor pair 511a and 511b (either T0 or T8).

Likewise, in layer 520, a second transistor pair 522a and 522b is also switched under the control of B2 and the complement of B2 (~B2). If B2 is high, 522b is switched on and 522a is off (since ~B2 would be low). This has the effect of passing through layer 520 the thermometer code bit passed by transistor pair 514a and 514b (either T6 or T14). If B2 is low, 522b is switched off and 522a is switched on (since ~B2 would be high). This has the effect of passing through layer 520 the thermometer code bit passed by transistor pair 513a and 513b (either T2 or T10).

Lastly, in layer 520, a third transistor pair 523a and 523b is also switched under the control of B2 and the complement of B2 (~B2). If B2 is high, 523b is switched on and 523a is off (since ~B2 would be low). This has the effect of passing through layer 520 the thermometer code bit passed by transistor pair 516a and 516b (either T5 or T13). If B2 is low, 523b is switched off and 523a is switched on (since ~B2 would be high). This has the effect of passing through layer 520 the thermometer code bit passed by transistor pair 515a and 515b (either T1 or T9).

The thermometer code bits passed through layer 520 by the operation of these layer 520 transistor pairs is passed to a third layer 530. The output provided by transistor pair 523a and 523b is observed to resolve the binary code bit B1, and thus, is not further switched. The outputs of transistor pairs 521a and 521b, and, 522a and 522b, are switched through a transistor pair 531a and 531b in layer 530 under control of B1 (and its complement, ~B1). When B1 is High, transistor 531b is switched on, and transistor 531a is switched off (since B1 would be low). As a result, the thermometer code bit passed by transistor pair 522a and 522b is switched through, while the output of pair 521a and 521b is suppressed. Since the output of the transistor pair 531a and 531b is the binary code bit B0, the bit B0 is resolved as the thermometer code bit passed through by transistor pair 522a and 522b when B1 is High. Likewise, when B1 is Low, transistor 531a is switched on, and transistor 531b is switched off (since ~B1 would be low). As a result, the thermometer code bit passed by transistor pair 521a and 521b is switched through, while the output of pair 522a and 522b is suppressed. Since the output of the transistor pair 531a and 531b is the binary code bit B0, the bit B0 is resolved as the thermometer code bit passed through by transistor pair 521a and 521b when B1 is Low.

Since the various transistor pairs of layers 510, 520 and 530, use complementary signal pairs to perform its switching, the complement of each of the signals used in switching must also be provided. Thus, various inverters are present in the data paths of the signals used to switch transistors. These inverters both provide a delay, so that the binary code bits that are resolved are provided to the final output in a concurrent fashion, and also, provide the complements of the signals used in switching. For instance, since the complement of B3 (~B3) as well as B3 itself is used to switch the transistors, an inverter 519 provides the complement of the thermometer code bit T7, and thus, the complement of B3. Likewise, since the complement of B2 and B2 itself is used to switch the transistors pairs of layer 520, an inverter 529 provides the complement of B2. Another inverter 536 is inserted in the data path of B2 so that B2 itself can be observed at the final output concurrently with other resolved binary code bits. Since the complement of B1 and B1 itself is used to switch the transistors pair of layer 530, an inverter 528 provides the complement of B1. Another inverter 537 is inserted in the data path of B1 so that B1 itself can be observed at the final output concurrently with other resolved binary code bits. The binary code bit B0, which is finally resolved by the transistor pair 531a and 531b of layer 530, is provided to the final output only after being delayed by a pair of inverters 538 and 539.

Advantageously, the CMOS implemented converter 500 of FIG. 5 can use only one type of standard logic cell in a repeated fashion instead of a specially designed ROM as with some conventional converters. The number of transistors required for the converter 500, which exemplifies a 4-bit Binary code generation from a thermometer code, is 38. In general, the number of MOS transistors required to encode a $2^n-1$ bit thermometer code into an n bit binary code is $2*(2^n-1)+4*n$, which is less than in conventional converters, hence reducing cost. The converter 500 yields the same logical results as does converter 400, and thus, also has a low sensitivity to bubble code abnormalities.

Figure 6:
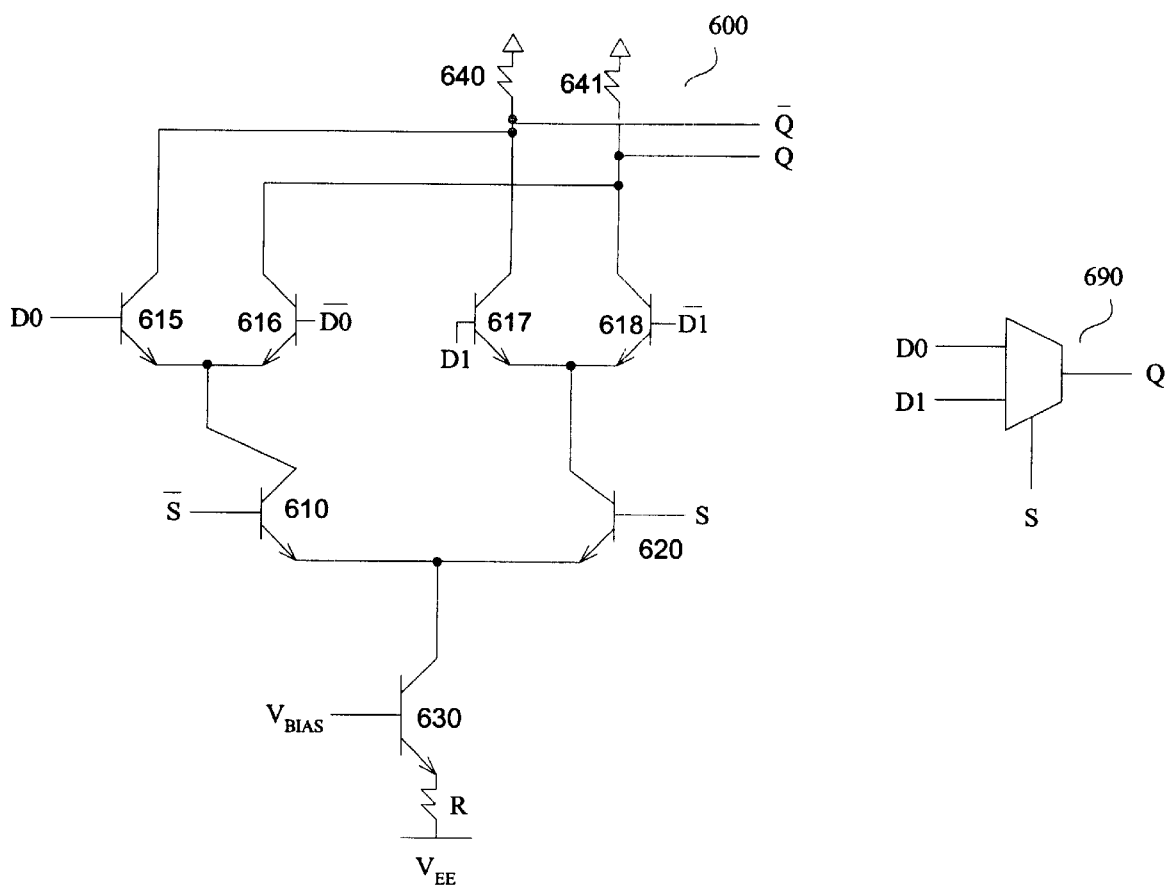
FIG. 6 illustrates a current-mode logic implementation of the multiplexers utilized in the embodiment of FIG. 4.

FIG. 6 illustrates a current-mode logic implementation of the multiplexers utilized in the embodiment of FIG. 4. This implementation of a multiplexer is readily known to those of skill in the art, and is described here for the sake of convenience. Each multiplexer depicted in FIG. 4 has two inputs, one output and a selector signal. Such a structure represented in the multiplexer equivalent 690 shown in FIG. 6 which has two inputs D0 and D1 and select signal S which controls the selection of the inputs to produce an output Q. Current-mode circuit 600 is a current steering circuit. Transistor 630 functions as a current source. The selector signal S, and its complement ~S steer the current generated by transistor 630 into one of two current paths. When selector signal S is high, transistor 620 is active and transistor 610 is off (since ~S is low). The current generated by current source transistor 630 is therefore steered to the differential pair comprising transistors 617 and 518. The current is then further steered into one of the two resistors 640 and 641 under control of the input D1 and its complement ~D1. The current results in a voltage drop across the resistor(s) which has the opposite sign, and thus, the D1 signal controls ~Q and ~D1 controls Q. In this case, the output Q is therefore low when D1 is low and high when D1 is high, thereby passing the logical value of D1 to the output.

Figure 7:
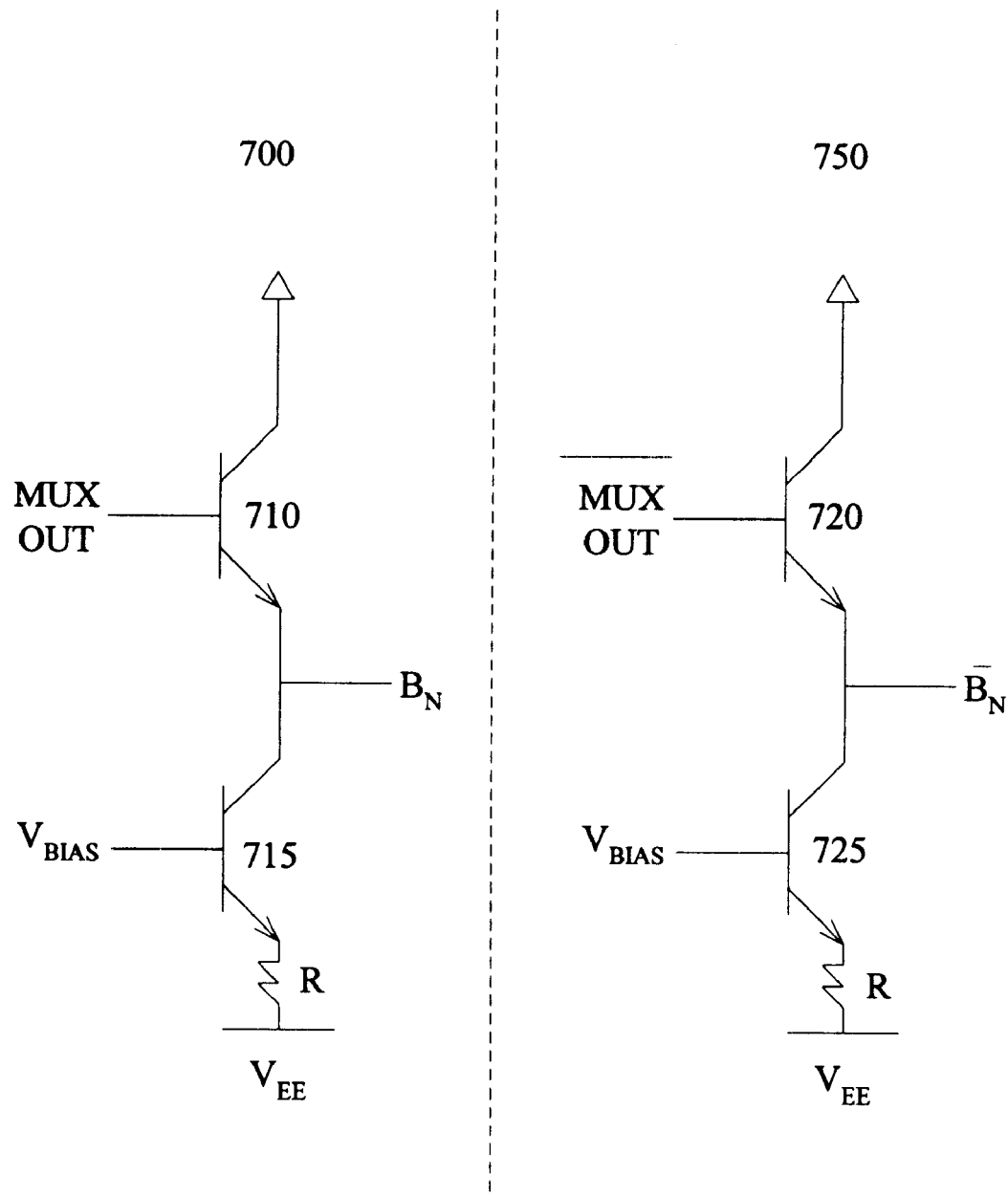
FIG. 7 illustrates a level shifter which accompanies multiplexer implemented in FIG. 6.

FIG. 7 illustrates a level shifter which accompanies multiplexer implemented in FIG. 6. The level shifter is implemented as an emitter follower circuit, as is well known in the art. Transistors 715 and 725 generate currents which result in a base-emitter voltage drop of 700 to 900 mV, depending on temperature and process, in transistors 710 and 720. The base-emitter voltage drop results in a level shift in the signal while transferring the high frequency signals.

By referring to FIGS. 4, 6 and 7, it can be readily observed that the number of transistors required for a current-steering implementation of an encoder to convert a $2^n-1$ bit thermometer code into an n bit binary code is $7*(2^n-1)+4*n$, which is less than in conventional converters, hence reducing cost. In addition, the current-steering implementation has the further advantage that all signals are differential throughout. This advantage is not shared by the conventional implementation, since the ROM must be implemented with single-ended signals. Single-ended signals generate more noise in power supply lines, and are more sensitive to noise coupled from other sources via the power supply lines.

Although the present invention has been described in detail with reference to the disclosed embodiments thereof, those skilled in the art will appreciate that various substitutions and modifications can be made to the examples described herein while remaining within the spirit and scope of the invention as defined in the appended claims.

TABLE 1

Thermometer and binary codes for the case of a 4-bit A/D converter

| | Thermometer code | | | | | | | | | | | | | | | Binary code | | | |
|---|---|---|---|---|---|---|---|---|---|---|---|---|---|---|---|---|---|---|---|
| Value | T0 | T1 | T2 | T3 | T4 | T5 | T6 | T7 | T8 | T9 | T10 | T11 | T12 | T13 | T14 | B3 | B2 | B1 | B0 |
| 0 | L | L | L | L | L | L | L | L | L | L | L | L | L | L | L | L | L | L | L |
| 1 | H | L | L | L | L | L | L | L | L | L | L | L | L | L | L | L | L | L | H |
| 2 | H | H | L | L | L | L | L | L | L | L | L | L | L | L | L | L | L | H | L |
| 3 | H | H | H | L | L | L | L | L | L | L | L | L | L | L | L | L | L | H | H |
| 4 | H | H | H | H | L | L | L | L | L | L | L | L | L | L | L | L | H | L | L |
| 5 | H | H | H | H | H | L | L | L | L | L | L | L | L | L | L | L | H | L | H |
| 6 | H | H | H | H | H | H | L | L | L | L | L | L | L | L | L | L | H | H | L |
| 7 | H | H | H | H | H | H | H | L | L | L | L | L | L | L | L | L | H | H | H |
| 8 | H | H | H | H | H | H | H | H | L | L | L | L | L | L | L | H | L | L | L |
| 9 | H | H | H | H | H | H | H | H | H | L | L | L | L | L | L | H | L | L | H |
| 10 | H | H | H | H | H | H | H | H | H | H | L | L | L | L | L | H | L | H | L |
| 11 | H | H | H | H | H | H | H | H | H | H | H | L | L | L | L | H | L | H | H |
| 12 | H | H | H | H | H | H | H | H | H | H | H | H | L | L | L | H | H | L | L |
| 13 | H | H | H | H | H | H | H | H | H | H | H | H | H | L | L | H | H | L | H |
| 14 | H | H | H | H | H | H | H | H | H | H | H | H | H | H | L | H | H | H | L |
| 15 | H | H | H | H | H | H | H | H | H | H | H | H | H | H | H | H | H | H | H |

TABLE 2

Responses of the prior-art coders and the invention to thermometer codes with a bubble of length one.

Figure 1:
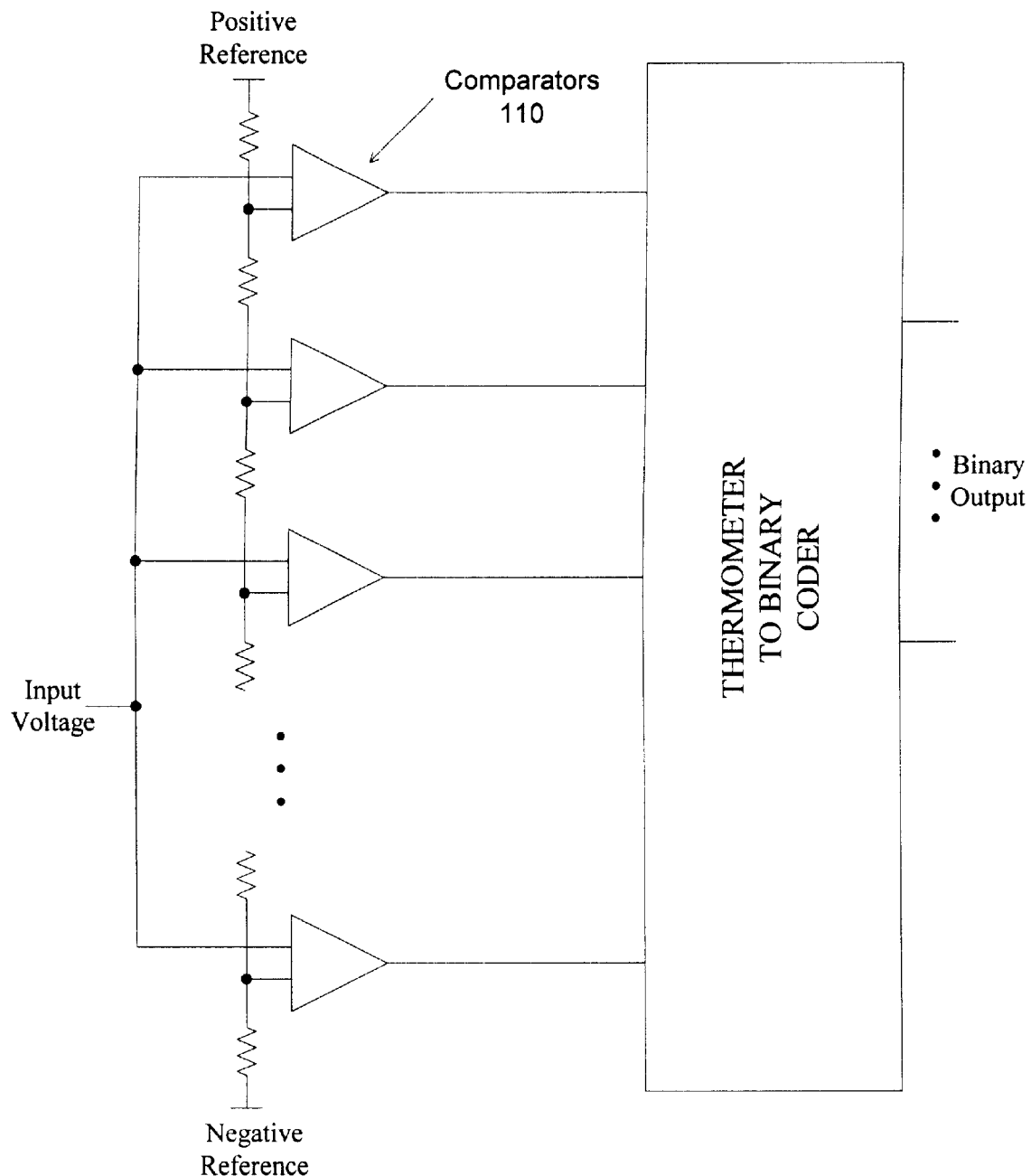
FIG. 1 illustrates a typical flash A/D converter.
Figure 2:
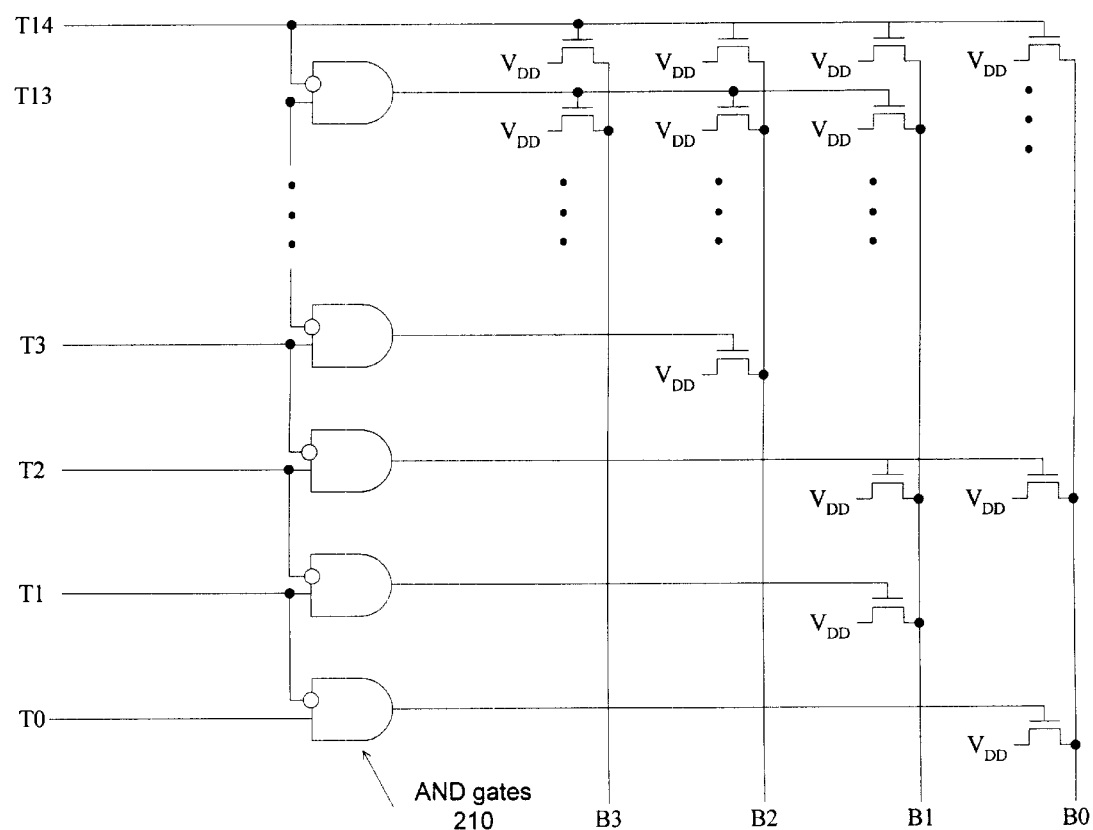
FIG. 2 shows a conventional thermometer-to-binary coder.
Figure 3:
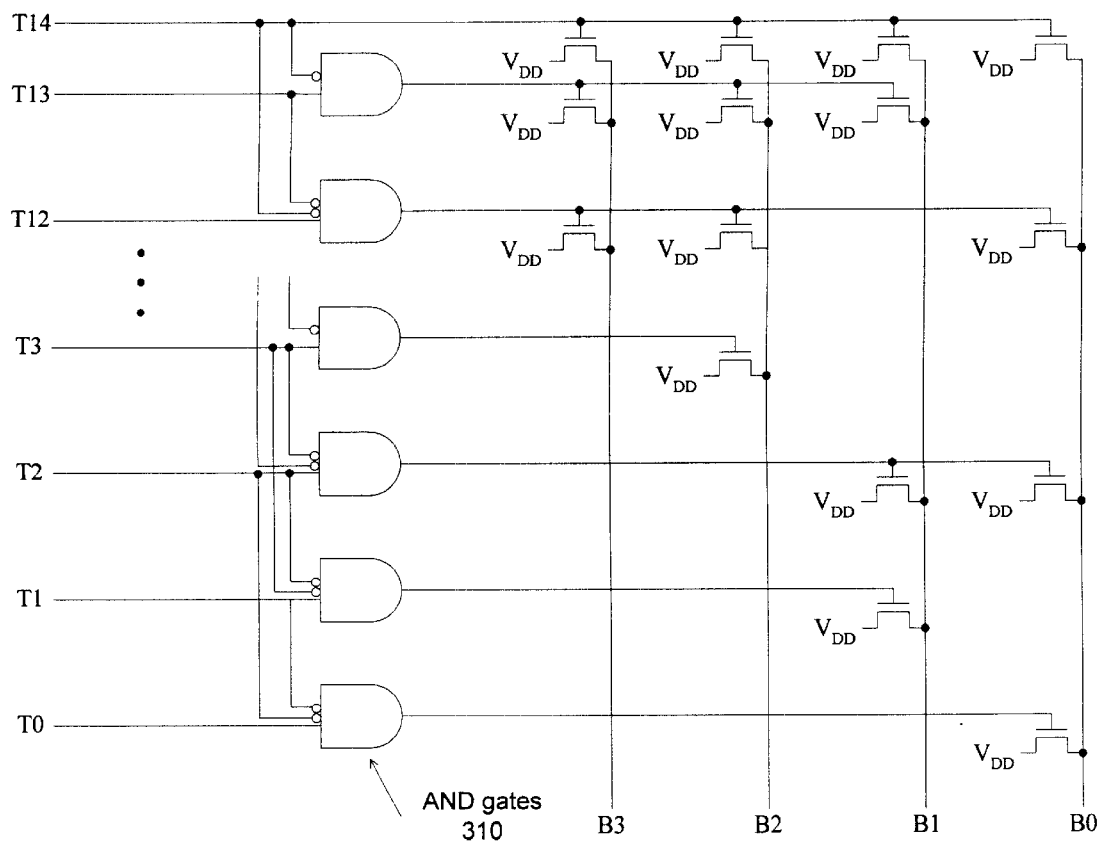
FIG. 3 illustrates another conventional thermometer-to-binary coder.

| Possible | "Bubble" Thermometer Code | | | | | | | | | | | | | | | Coded value | | |
|---|---|---|---|---|---|---|---|---|---|---|---|---|---|---|---|---|---|---|
| Values | T0 | T1 | T2 | T3 | T4 | T5 | T6 | T7 | T8 | T9 | T10 | T11 | T12 | T13 | T14 | FIG. 2 | FIG. 3 | FIG. 4 |
| 0, 2 | L | H | L | L | L | L | L | L | L | L | L | L | L | L | L | 2 | 2 | 2 |
| 1, 3 | H | L | H | L | L | L | L | L | L | L | L | L | L | L | L | 3 | 3 | 1 |
| 2, 4 | H | H | L | H | L | L | L | L | L | L | L | L | L | L | L | 6 | 4 | 4 |
| 3, 5 | H | H | H | L | H | L | L | L | L | L | L | L | L | L | L | 7 | 5 | 3 |
| 4, 6 | H | H | H | H | L | H | L | L | L | L | L | L | L | L | L | 6 | 6 | 6 |
| 5, 7 | H | H | H | H | H | L | H | L | L | L | L | L | L | L | L | 7 | 7 | 5 |
| 6, 8 | H | H | H | H | H | H | L | H | L | L | L | L | L | L | L | 14 | 8 | 8 |
| 7, 9 | H | H | H | H | H | H | H | L | H | L | L | L | L | L | L | 15 | 9 | 7 |
| 8, 10 | H | H | H | H | H | H | H | H | L | H | L | L | L | L | L | 10 | 10 | 10 |

TABLE 2-continued

Responses of the prior-art coders and the invention to thermometer codes with a bubble of length one.

| Possible Values | "Bubble" Thermometer Code | | | | | | | | | | | | | | | Coded value | | |
|---|---|---|---|---|---|---|---|---|---|---|---|---|---|---|---|---|---|---|
| | T0 | T1 | T2 | T3 | T4 | T5 | T6 | T7 | T8 | T9 | T10 | T11 | T12 | T13 | T14 | FIG. 2 | FIG. 3 | FIG. 4 |
| 9, 11 | H | H | H | H | H | H | H | H | H | L | H | L | L | L | L | 11 | 11 | 9 |
| 10, 12 | H | H | H | H | H | H | H | H | H | H | L | H | L | L | L | 14 | 12 | 12 |
| 11, 13 | H | H | H | H | H | H | H | H | H | H | H | L | H | L | L | 15 | 13 | 11 |
| 12, 14 | H | H | H | H | H | H | H | H | H | H | H | H | L | H | L | 14 | 14 | 14 |
| 13, 15 | H | H | H | H | H | H | H | H | H | H | H | H | H | L | H | 15 | 15 | 13 |

What is claimed is:

1. A method for resolving a binary code of N bits from a thermometer code of M bits:
   grouping said thermometer code bits into a plurality of groups by observing common features among them; and
   selecting from said groups of thermometer code bits M thermometer code bits that can be utilized as the N binary code bits, said grouping not characteristic of a one-hot code, further wherein said selecting implemented using only one kind of circuit element, said grouping and said selecting absent of any memory operation.

2. A method according to claim 1 further comprising:
   distributing the groups into a plurality of layers.

3. A method according to claim 2 wherein selecting includes:
   selecting from a current layer of said layers a portion of thermometer code bits input to said current layer as the inputs to a layer successive to said current layer.

4. A method according to claim 3 wherein said selecting from a current layer is repeatedly performed for every one of said layers.

5. A method according to claim 4 wherein a binary code bit is resolved at each of said layers and at the grouping of the first of said groups, the binary code bit resolved at said current layer controls the selecting process for inputs to said successive layer.

6. A method according to claim 5 wherein one of said thermometer code bits of said first group is resolved as the least significant of said binary code bits.

7. A method according to claim 1 wherein said selecting is done in pairs.

8. A method according to claim 3 wherein the number of layers is N-1.

9. A method according to claim 5 wherein selected resolved binary code bits are buffered such that all of the binary code bits are available in a concurrent fashion.

10. An apparatus configured to resolve a binary code of N bits from a thermometer code of M bits, comprising:
    a grouping logic configured to group said thermometer code bits into groups of common feature, said grouping logic organized into a plurality of selection layers, each selection layer configured to accept as its inputs thermometer code bits selected from a previous selection layer, said grouping logic further configured not to provide a one-hot code, said grouping logic implemented without the use of memory elements, said grouping logic consisting of:
    a set of selection mechanisms for each of said plurality of selection layers, each selection mechanism configured to accept a plurality of input thermometer code bits thereto and provide one output thermometer code bit therefrom, wherein each said selection layer is configured to resolve a binary code bit, each said selection mechanism comprising:
    a first transistor switched active under control of said resolved binary code bit, said first transistor passing a thermometer code bit coupled to it when active, and suppressing same when not active; and
    a second transistor switched active under control of the complement of said resolved binary bit, said second transistor passing a thermometer code bit coupled to it when active and suppressing same when not active, further wherein said second transistor and first transistor are not simultaneously active under normal operation.

11. An apparatus according to claim 10 wherein the number of selection layers is N-1.

12. An apparatus according to claim 11 wherein the first of said groups resolves the least significant of said binary code bits.

13. An apparatus according to claim 12 wherein said resolved binary code bit of one layer is used to control the set of selection mechanisms for a successive layer.

14. An apparatus according to claim 13 wherein said selection mechanisms are multiplexers.

15. An apparatus according to claim 10 further comprising:
    a plurality of inverters, said inverters configured to provide complements of said resolved binary bits as needed, and configured to enable all said resolved binary code bits to be available in a concurrent fashion.

16. An apparatus according to claim 12 further comprising:
    a plurality of buffering mechanisms coupled to said selection layers such that all resolved binary code bits are available in a concurrent fashion.

17. An apparatus configured to resolve a binary code of N bits from a thermometer code of M bits, comprising:
    a grouping logic configured to group said thermometer code bits into groups of common feature, said grouping logic organized into a plurality of selection layers, each selection layer configured to accept as its inputs thermometer code bits selected from a previous selection layer, said grouping logic further configured not to provide a one-hot code, said grouping logic implemented without the use of memory elements, said grouping logic consisting of:
    a set of selection mechanisms for each of said plurality of selection layers, each selection mechanism configured to accept a plurality of input thermometer code bits thereto and provide one output thermometer code bit therefrom, wherein each said selection layer is configured to resolve a binary code bit, each said selection mechanism comprising:
- a first pair of transistors driven by said resolved binary code bit, said first pair when driven active configured to provide a first of said inputs to said selection mechanism and the complement thereof as the output of said selection mechanism; and
- a second pair of transistors driven by the complement of said resolved binary code bit, said second pair when driven active configured to provide a second of said inputs to said selection mechanism and the complement thereof as the output of said selection mechanism, further wherein said first and said second pairs are not active simultaneously, wherein said pairs of transistors allow said apparatus to be implemented using only one kind of circuit element.

18. An apparatus according to claim 17 further comprising a fifth transistor coupled to said first pair, the base of said fifth transistor coupled to said resolved binary code bit, said fifth transistor configured to drive said first pair active when said resolved binary code bit is high.

19. An apparatus according to claim 17 further comprising a sixth transistor coupled to said second pair, the base of said sixth transistor coupled to the complement of said resolved binary code bit, said sixth transistor configured to drive said second pair active when the complement of said resolved binary code bit is high.

20. An apparatus according to claim 17 wherein said output includes a terminal providing said input being driven by said selection mechanism and a terminal for the complement of said input being driven by said selection mechanism.

* * * * *